US008525598B2

United States Patent
Saini

(10) Patent No.: US 8,525,598 B2
(45) Date of Patent: Sep. 3, 2013

(54) DIGITAL TO ANALOG CONVERTER FOR PHASE LOCKED LOOP

(75) Inventor: Pravesh Kumar Saini, Saharanpur (IN)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 13/351,232

(22) Filed: Jan. 17, 2012

(65) Prior Publication Data
US 2013/0181780 A1 Jul. 18, 2013

(51) Int. Cl.
*H03L 7/00* (2006.01)

(52) U.S. Cl.
USPC .................. 331/34; 331/16; 327/103

(58) Field of Classification Search
USPC ............ 331/16, 17, 34; 327/103, 109, 156, 327/157; 341/120, 144, 145, 150
See application file for complete search history.

(56) References Cited

U.S. PATENT DOCUMENTS

| | | | |
|---|---|---|---|
| 5,329,192 A * | 7/1994 | Wu et al. ................. | 327/387 |
| 6,693,987 B1 | 2/2004 | Hattori | |
| 6,873,218 B2 | 3/2005 | Khlat | |
| 7,409,028 B2 | 8/2008 | Ham, III | |
| 2006/0114069 A1 | 6/2006 | Kojima | |
| 2011/0285433 A1 | 11/2011 | Hezar | |
| 2013/0076403 A1 * | 3/2013 | Wang et al. .............. | 327/103 |

OTHER PUBLICATIONS

Koichi Ishida, Kouichi Kanda, Atit Tamtrakarn, Hiroshi Kawaguchi, and Takayasu Sakurai, Managing Leakage in Charge-Based Analog Circuits with Low-VTH Transistors by Analog T-Switch (AT-Switch) and Super Cut-off CMOS, 2005 Symposium on VLSI Circuits—Digest of Technical Papers, Jun. 16-18, 2005, pp. 122-125, IEEE.

* cited by examiner

*Primary Examiner* — Joseph Chang
*Assistant Examiner* — Jeffrey Shin
(74) *Attorney, Agent, or Firm* — Charles Bergere

(57) ABSTRACT

A digital to analog converter (DAC) that reduces sub-threshold leakage current in PLLs includes three series connected transistors, a unity gain buffer, and a switch. The system is connected between the voltage-to-current converter and a current-controlled oscillator. The DAC receives and accurately mirrors a current signal generated by a voltage-to-current converter.

19 Claims, 2 Drawing Sheets

DIGITAL TO ANALOG CONVERTER FOR PHASE LOCKED LOOP

BACKGROUND OF THE INVENTION

The present invention relates generally to a phase-locked loop (PLL), and more particularly, to a digital to analog converter that reduces the effects of sub-threshold leakage current in a PLL.

A PLL is used to generate an oscillator signal based on an input reference signal. The oscillator signal has a phase that is directly related to the phase of the input reference signal. PLLs are widely used in modern electronic systems such as radios, telecommunication systems, computers, and so forth. In communication systems, PLLs are used to generate oscillator signals that are used for modulation and demodulation of a message signal. In electronic circuits, PLLs generate oscillator signals that are used as clock signals for synchronous operation of the circuits. To generate an oscillator signal having a predefined phase characteristic, an input reference signal and a feedback signal derived from the oscillator signal, are used. Subsequent to a time period known as the lock time, the phase of the oscillator signal locks to the phase of the input reference signal according to a predefined relationship. For example, the PLL may be programmed to generate the oscillator signal having a frequency that is an integer multiple of the frequency of the input reference signal.

In operation, a control voltage signal corresponding to the input reference signal is generated. The control voltage signal is converted to a current signal and the current signal is mirrored into a current-controlled oscillator (CCO) using current mirror circuits, such as digital-to-analog converters (DACs). The CCO generates the oscillator signal based on the mirrored current signal. This type of circuit functions satisfactorily for low frequency range PLLs. However, it fails to produce oscillator signals with satisfactory fidelity in high frequency range (>50 MHz) PLLs. Defects are introduced by sub-threshold leakage currents generated by internal transistors of the DAC when the DAC is in a non-conducting state. The current signals required for generation of low-frequency oscillator signals have small magnitudes that are comparable with the magnitudes of the sub-threshold leakage currents. Due to the comparable magnitudes of the current signals and the sub-threshold leakage currents, the leakage currents can substantially alter the magnitude of current signals provided to the CCO, causing the frequency of the oscillator signal to differ from the desired frequency, which leads to poor locking of the PLL.

The above-described problem may be overcome by designing the internal transistors to have a much greater length (L) than a minimum length allowed by the process. However, increasing the length causes an increase in the voltage headroom of the transistor, which may be reduced by increasing the transistor width (W) by a factor of 10 or more. However, the area of the transistor becomes 100 times or greater for the same voltage headroom with reduced leakage current and results in an increased silicon area and increased product cost.

Another method to overcome the problem of leakage currents is to predict the magnitude of the leakage current generated as a function of the control voltage signal. However, the absence of accurate mathematical models in less studied systems magnifies the above-described shortcoming. Additionally, the problem is exacerbated at fast corners of transistors and high temperatures.

Therefore, it would be advantageous to have a PLL with reduced effects of sub-threshold leakage current and that overcomes the above-mentioned limitations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
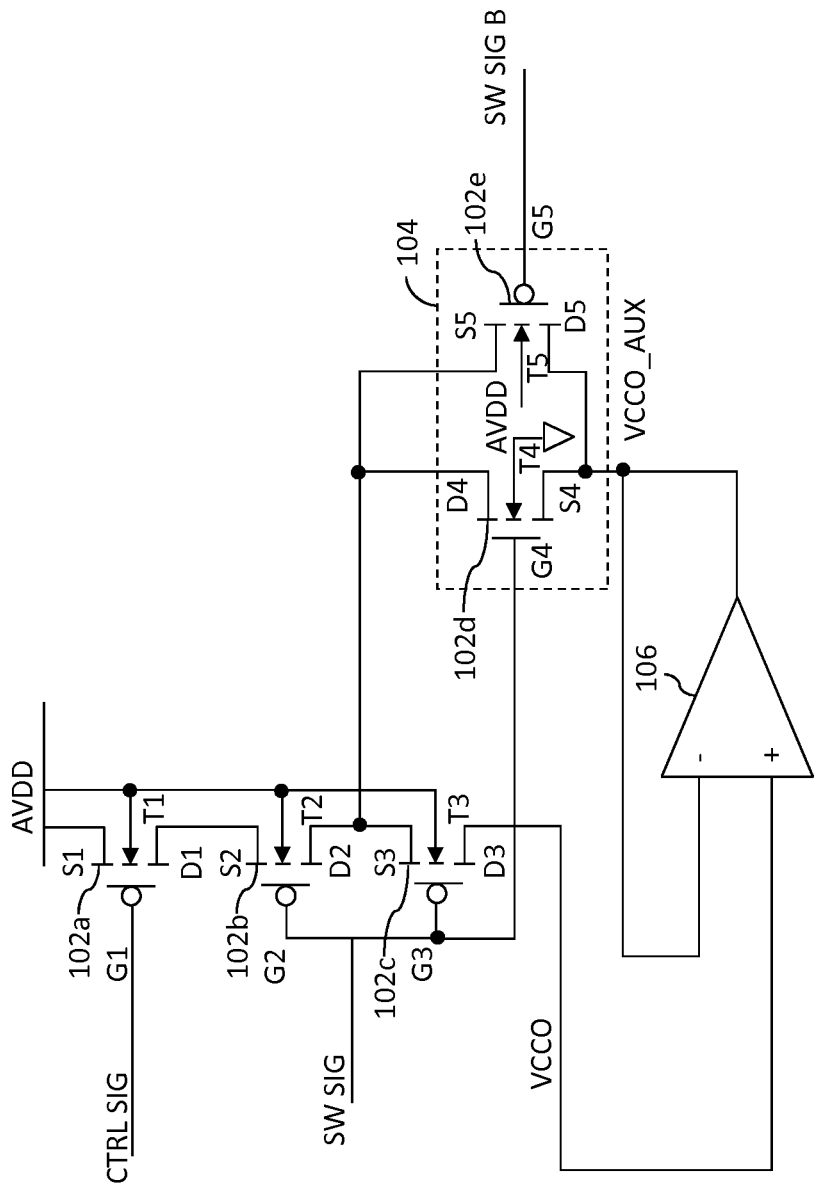
FIG. 1 is a schematic diagram of a DAC in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a digital to analog converter (DAC) for mirroring current is provided. The DAC includes first, second and third transistors. The first transistor has a gate terminal connected that receives a control signal from an external circuit, and source and substrate terminals connected to a voltage source. The first transistor generates a first intermediate signal. The second transistor has a source terminal connected to a drain terminal of the first transistor for receiving the first intermediate signal, a substrate terminal connected to the voltage source, and a gate terminal for receiving a switching signal. The second transistor generates a second intermediate signal. The third transistor has a source terminal connected to a drain terminal of the second transistor for receiving the second intermediate signal, a substrate terminal connected to the voltage source, a drain terminal, and a gate terminal that receives the switching signal. The third transistor generates a third intermediate signal, which may be provided to another external circuit. A unity gain buffer has a positive input terminal connected to the drain terminal of the third transistor, and an output terminal that generates a fourth intermediate signal. The output terminal of the unity gain buffer is connected to a switch. The switch is connected to the drain and source terminals of the second and the third transistors, respectively and transmits the fourth intermediate signal to the source terminal of the third transistor, based on an inverted value of the switching signal and the switching signal.

In another embodiment of the present invention, a voltage-controlled oscillator (VCO) for generating an oscillator signal is provided. The VCO includes a voltage-to-current converter for generating a control signal based on a control voltage. The voltage-to-current converter is connected to a digital-to-analog converter (DAC) that mirrors the control signal. The DAC includes first, second and third series connected transistors. The first transistor has a gate terminal connected to the voltage-to-current converter for receiving the control signal, and source and substrate terminals connected to a voltage source. The first transistor generates a first intermediate signal based on the control signal and passes it to the second transistor whose source terminal is connected to a drain terminal of the first transistor. A substrate terminal of the second transistor is connected to the voltage source, and a gate terminal receives a switching signal. The second transistor generates a second intermediate signal that it passes to the third transistor by way of its drain terminal being connected to a source terminal of the third transistor. The third transistor has a substrate terminal connected to the voltage source, and a gate terminal that receives the switching signal. The third transistor generates a third intermediate signal at its drain terminal. A unity gain buffer has a positive input terminal that receives the third intermediate signal and generates a fourth intermediate signal at its output terminal. The output terminal of the unity gain buffer is connected to a switch and the switch is connected to drain and source terminals of the second and the third transistors, respectively. The switch transmits the fourth intermediate signal to the source terminal of the third transistor. The drain terminal of the third transistor is connected to a current-controlled oscillator (CCO). The CCO receives the third intermediate signal and generates the oscillator signal based on the third intermediate signal.

In yet another embodiment of the present invention, a a phase-locked loop (PLL) for generating an oscillator signal is provided. The PLL includes a phase and frequency detector (PFD) for receiving an input reference signal and generating an analog error signal based on the input reference signal and a feedback signal. The feedback signal is generated using the oscillator signal. The PFD is connected to a charge pump for generating a drive current based on the analog error signal. The charge pump is connected to an analog filter that generates a control voltage based on the drive current. The analog filter is connected to a voltage-controlled oscillator (VCO) for generating the oscillator signal based on the control voltage, and the VCO is as previously described, including the previously described DAC. The VCO also includes a current-controlled oscillator (CCO) connected to the DAC for generating the oscillator signal. A frequency divider is connected to the CCO for generating the feedback signal by adjusting the frequency of the oscillator signal.

Various embodiments of the present invention provide a circuit for mirroring current. The circuit includes three transistors, in which a drain terminal of a first transistor is connected to a source terminal of a second transistor and a drain terminal of the second transistor is connected to a source terminal of a third transistor. A drain terminal of the third transistor is connected to a unity gain buffer. The circuit further includes a switch that is connected to a node between the drain and source terminals of the second and the third transistors respectively, an output terminal of the unity gain buffer, and gates of the second and third transistors. The switch is switched OFF when the second and the third transistors are switched ON and vice-versa. The switching results in a voltage at the output terminal of the unity gain buffer being transmitted to the node between the drain and source terminals of the second and the third transistors, respectively. Since, the output terminal of the unity gain buffer follows a voltage at the drain terminal of the third transistor, the voltage at the drain terminal of the third terminal is about equal to the voltage at the source terminal of the third transistor. As a result, the drain-to-source voltage of the third transistor is reduced considerably, which reduces the sub-threshold leakage current. An increase in the voltage at the source terminal of the third transistor reduces the gate-to-source voltage of the third transistor, which further reduces the sub-threshold leakage current. Reduction of the sub-threshold leakage current enhances the mirroring accuracy of the circuit and provides improved regulation of the output current of the circuit.

Referring now to FIG. 1, a schematic diagram of a digital-to-analog converter (DAC) 100 in accordance with an embodiment of the present invention is shown. The DAC 100 includes a plurality of transistors including first through fifth transistors 102a-102e, a switch 104, and a unity gain buffer 106.

The first transistor 102a receives a control signal (CTRL SIG) at a gate terminal G1, from an external circuit. In an embodiment of the present invention, the control signal is a current signal generated using a voltage-to-current converter (see FIG. 2). The voltage-to-current converter and the DAC 100 may be a part of a voltage-control oscillator (VCO) used in a PLL. A source terminal S1 and a substrate terminal T1 of the first transistor 102a are connected to a constant voltage source AVDD. The drain terminal D1 and the substrate terminal T1 of the first transistor 102a are connected to a source terminal S2 and a substrate terminal T2, respectively, of the second transistor 102b. A drain terminal D2 of the second transistor 102b is connected to a source terminal S3 of the third transistor 102c. The substrate terminal T2 of the second transistor 102b is connected to a substrate terminal T3 of the third transistor 102c. Gate terminals G2 and G3 of the second and third transistors 102b and 102c are connected together and receive a switching signal (SW SIG). A drain terminal D3 of the third transistor 102c is connected to a positive input terminal of the unity gain buffer 106. A negative input terminal of the unity gain buffer 106 is connected to an output terminal of the unity gain buffer 106. The switch 104 is connected between the output terminal of the unity gain buffer 106, and the drain and source terminals D2 and S3 of the second and third transistors 102b and 102c, respectively. In an embodiment of the present invention, the transistors 102a-102c are P-type metal-oxide-semiconductor (PMOS) transistors.

The switch 104 includes the fourth and fifth transistors 102d and 102e. A drain terminal D4 of the fourth transistor 102d is connected to the drain and source terminals D2 and S3 of the second and third transistors 102b and 120c, respectively. A source terminal S4 of the fourth transistor 102d is connected to the output terminal of the unity gain buffer 106. A substrate terminal T4 of the fourth transistor 102d is connected to ground, and a gate terminal G4 of the fourth transistor 102d is connected to the gate terminals G2 and G3 of the second and third transistors 102b and 120c, and receives the switching signal (SW_SIG).

A source terminal S5 of the fifth transistor 102e is connected to the drain terminal D4 of the fourth transistor 102d, and a drain terminal D5 of the fifth transistor 102e is connected to the output terminal of the unity gain buffer 106. A substrate terminal T5 of the fifth transistor 102e is connected to the constant voltage source AVDD. A gate terminal G5 of the fifth transistor 102e receives an inverted value of the switching signal (SW SIG B).

In operation, the control signal to be mirrored, e.g., a CCO signal (CCO, not shown) in the present example, is provided at the gate terminal G1 of the first transistor 102a. The first transistor 102a generates a first intermediate signal at the drain terminal D1. The first intermediate signal is transmitted to the source terminal S2 of the second transistor 102b. Transmission of the first intermediate signal is controlled by the switching signal. The switching signal is used to control the ON/OFF switching operations of the second and third transistors 102b and 102c, to control the mirroring of first intermediate signal. It will understood by persons skilled in the art that a VCO may include multiple DAC units 100 connected in parallel and the control signal provided to the DAC units 100 is controlled by ON/OFF switching of the DAC units 100 based on the switching signal. The switching signal is generated based on a magnitude of the control signal that is to be mirrored by the CCO, which in turn is determined by an operating frequency of the PLL.

The second transistor 102b generates a second intermediate signal in a conducting state, in response to the first intermediate signal. The second intermediate signal is transmitted to the source terminal S3 of the third transistor 102c by way of the drain terminal D2 of the second transistor 102b. The third transistor 102c generates a third intermediate signal. The third intermediate signal (VCCO) is provided to the positive input terminal of the unity gain buffer 106. The unity gain buffer generates a fourth intermediate signal (VCCO_AUX) that follows the voltage at the positive input terminal (the third intermediate signal). The fourth intermediate signal is provided to the source terminal S4 of the fourth transistor 102d. In an embodiment of the present invention, the fourth transistor 102d is an N-type metal oxide semiconductor (NMOS) transistor while the first through third and fifth transistors 102a-102c, 102e are PMOS transistors. The switching signal provided at the gate terminal G4 of the fourth transistor 102d controls the switching of the fourth transistor 102d and consequently the transmission of the fourth intermediate signal through the fourth transistor 102d. The second and third transistors 102b and 102c are configured such that the second and third transistors 102b and 102c switch OFF when the fourth transistor 102d is switched ON and vice-versa. As a result, the fourth intermediate signal that is approximately equal to the third intermediate signal (in magnitude) is transmitted to the drain terminal D4 of the fourth transistor 102d and subsequently to the drain terminal D2 and the source terminal S3 of the second and third transistors 102b, 102c. Since the voltages at the drain and source terminals D3 and S3 become almost equal, the drain-to-source voltage ($V_{DS}$) of the third transistor 102c is reduced to almost zero. Further, the gate-to-source voltage ($V_{GS}$) of the third transistor 102c is reduced to a value that is below zero. As a result, the superfluous flow of sub-threshold leakage current into the CCO, when the DAC 100 is switched OFF, is eliminated.

Theoretically, the sub-threshold leakage current is given by the equation (1), $$I_{DS}=\mu_0 C_{ox}*(W/L)*(m-1)*(v_T)^2*e^{(\{VGS-VTH\}/\{m*vT\})}*(1-e^{-VDS/vT}) \quad (1)$$

Where,
$I_{DS}$=sub-threshold leakage current
$\mu_0$=mobility of carriers,
$C_{ox}$=gate oxide capacitance per unit area
W, L=width and length of the transistor,
m=body effect coefficient,
$v_T$=thermal voltage,
$V_{GS}$=gate-to-source voltage,
$V_{TH}$=threshold voltage,
$V_{DS}$=drain-to-source voltage Equation (1) shows that the sub-threshold leakage current, $I_{DS}$, is a function of $V_{GS}$ and $V_{ds}$. Thus, the sub-threshold leakage current of the third transistor 102c reduces to zero when $V_{DS}$ becomes zero and $V_{GS}$ is reduced to a value that is below zero.

The fifth transistor 102e is provided with an inverted switching signal at a gate terminal G5. Thus, the fifth transistor 102e switches ON and OFF in synchronism with the fourth transistor 102d. The fourth and the fifth transistors 102d and 102e form a transmission gate that is switched ON when the inverted switching signal is low and vice-versa. In an embodiment of the present invention, when the magnitude of the third intermediate signal is greater than VDD, the switch 104 is designed using only the fifth transistor 102e (a PMOS transistor). In another embodiment of the present invention, when the magnitude of the third intermediate signal is less than zero, the switch 104 is designed using only the fourth transistor 102d (an NMOS transistor). In another embodiment of the present invention, when the magnitude of the third intermediate signal is between zero and AVDD, the switch 104 is designed using both the fourth and fifth transistors 102d and 102e.

Figure 2:
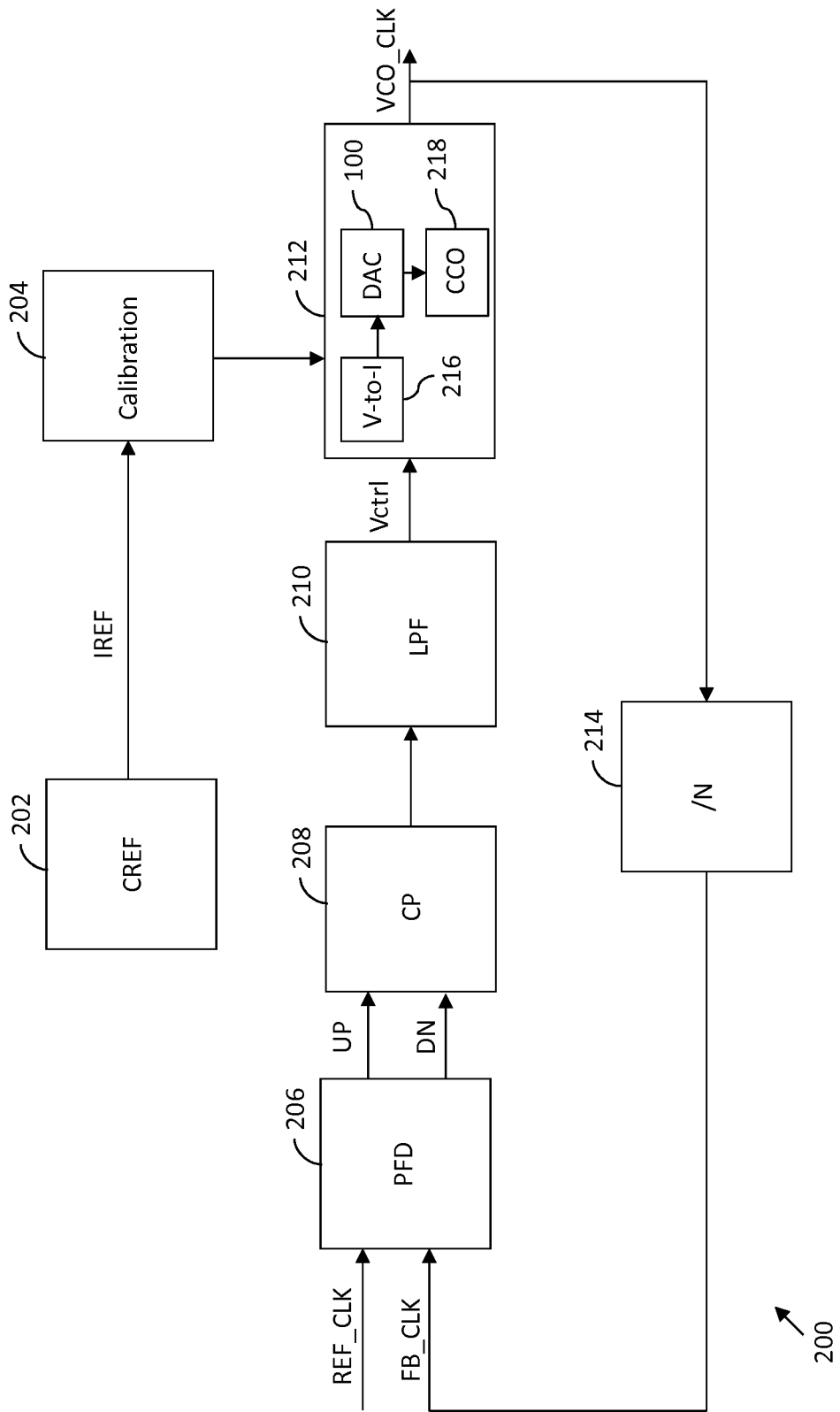
FIG. 2 is a schematic diagram of a PLL including the DAC of FIG. 1, in accordance with an embodiment of the present invention.

Referring now to FIG. 2, a schematic diagram of a PLL 200 in accordance with an embodiment of the present invention is shown. The DAC 100 is part of the PLL 200. Additionally, the PLL 200 includes a reference current generator (CREF) 202, a calibration circuit 204, a phase and frequency detector (PFD) 206, a charge pump (CP) 208, a low-pass filter (LPF) 210, a VCO 212, a frequency divider 214, a voltage-to-current (V-to-I) converter 216, and a current-controlled oscillator (CCO) 218.

The PLL 200 is calibrated by the calibration circuit 204 that receives a reference current ($I_{REF}$) generated by the CREF 202. The calibration circuit 204 coarse tunes the PLL 200 so that an oscillator signal (VCO_CLK) produced by the PLL 200 has a frequency close to the desired frequency. In an embodiment of the present invention, the PLL 200 is a high-frequency range PLL. After calibration, the PLL 200 is provided with a reference clock signal (REF_CLK). The PLL 200 generates the oscillator signal having a frequency that is a predetermined multiple (N) the reference clock signal frequency. The reference clock signal is provided to the PFD 206. The PFD 206 also receives a feedback signal (FB_CLK) from the frequency divider 214. The PFD 206 generates an analog error signal based on whether a frequency of the reference clock signal is greater or less than a frequency of the feedback signal. The analog error signal includes an UP signal or a DOWN signal based on whether the frequency of the oscillator signal needs to be increased or decreased, respectively. The PFD 206 provides the analog error signal to the CP 208. The CP 208 generates a drive current based on the analog error signal. As is understood by those of skill in the art, the CP 208 sources or sinks the drive current to or from the LPF 210 based on whether the analog error signal is an UP signal or a DOWN signal. The LPF 210 generates a control signal (Vctrl) based on the drive current and transmits the control signal to the V-to-I converter 216. The V-to-I converter 216 converts the control signal to a current signal and transmits the current signal to a mirroring circuit, i.e. the DAC 100.

The DAC 100, based on a switching signal, mirrors a portion of the current signal to the CCO 218, as described above with reference to FIG. 1. The switching signal is generated based on the portion the current signal that needs to be mirrored, which in turn is generated based on the operating frequency of the PLL 200. The CCO 218 generates the oscillator signal based on the mirrored portion of the current signal. As explained above with reference to FIG. 1, the DAC 100 has a reduced sub-threshold leakage current. As a result, the mirroring accuracy of the DAC 100 is very precise. Therefore, the magnitude of the current signal mirrored to the CCO 218 is close to the desired magnitude, which leads to the oscillator signal having a frequency that is closer to the desired frequency, which increases the reliability of the PLL 200.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A digital to analog converter (DAC) for mirroring current, comprising:
   a first transistor having a gate terminal that receives a control signal, and source and substrate terminals connected to a voltage source, wherein the first transistor generates a first intermediate signal;
   a second transistor having a source terminal connected to a drain terminal of the first transistor for receiving the first intermediate signal, a substrate terminal connected to the voltage source, and a gate terminal that receives a switching signal, wherein the second transistor generates a second intermediate signal;
   a third transistor having a source terminal connected to a drain terminal of the second transistor for receiving the second intermediate signal, a substrate terminal connected to the voltage source, and a gate terminal that receives the switching signal, wherein the third transistor generates a third intermediate signal;
   a unity gain buffer, connected to the third transistor, for generating a fourth intermediate signal; and
   a switch, connected to an output terminal of the unity gain buffer, and drain and source terminals of the second and the third transistors, respectively, for transmitting the fourth intermediate signal to the source terminal of the third transistor.

2. The DAC of claim 1, wherein the switch comprises a fourth transistor having a drain terminal connected to the drain and source terminals of the second and third transistors, respectively, a source terminal connected to an output terminal of the unity gain buffer, a substrate terminal connected to ground, and a gate terminal for receiving the switching signal.

3. The DAC of claim 2, wherein the switch further comprises a fifth transistor having a source terminal connected to the drain terminal of the fourth transistor, a drain terminal connected to the output terminal of the unity gain buffer, a substrate terminal connected to the voltage source, and a gate terminal for receiving an inverted value of the switching signal.

4. The DAC of claim 3, wherein the third and fourth intermediate signals have the same magnitude when the second, and third transistors are switched off, and the fourth and fifth transistors are switched on.

5. The DAC of claim 3, wherein the first, second, third, and fifth transistors are positive metal-oxide semiconductor (PMOS) transistors and fourth transistor is a negative MOS transistor.

6. The DAC of claim 3, wherein the unity gain buffer has a positive input terminal connected to the drain of the third transistor, and a negative input terminal connected to its output terminal and to a source of the fourth transistor.

7. The DAC of claim 6, wherein the DAC is connected between a voltage to current converter of a voltage controlled oscillator (VCO) and a current controlled oscillator (CCO), receives the control signal from the voltage to current converter, mirrors the control signal, and provides a mirrored portion of the control signal to the CCO.

8. The system of claim 7, wherein a plurality of the DACs are connected in parallel between the voltage to current converter and the CCO to control the magnitude of current mirrored to the CCO.

9. A voltage-controlled oscillator (VCO) for generating an oscillator signal, comprising:
   a voltage-to-current converter for generating a control signal based on a control voltage;
   a digital-to-analog converter (DAC), connected to the voltage-to-current converter, for mirroring the control signal, wherein the DAC comprises:
      a first transistor having a gate terminal connected to the voltage-to-current converter, for receiving the control signal, and source and substrate terminals connected to a voltage source, wherein the first transistor generates a first intermediate signal;
      a second transistor having a source terminal connected to a drain terminal of the first transistor for receiving the first intermediate signal, a substrate terminal connected to the voltage source, and a gate terminal for receiving a switching signal, wherein the second transistor generates a second intermediate signal;
      a third transistor having a source terminal connected to a drain terminal of the second transistor for receiving the second intermediate signal, a substrate terminal connected to the voltage source, and a gate terminal for receiving the switching signal, wherein the third transistor generates a third intermediate signal;
      a unity gain buffer, connected to the third transistor, for generating a fourth intermediate signal; and
      a switch, connected to an output terminal of the unity gain buffer, and drain and source terminals of the second and the third transistors, respectively, for transmitting the fourth intermediate signal to the source terminal of the third transistor based on the switching signal and an inverted value of the switching signal; and
   a current-controlled oscillator (CCO), connected to the DAC, for receiving the third intermediate signal and generating the oscillator signal.

10. The VCO of claim 9, wherein the switch comprises a fourth transistor having a drain terminal connected to drain and source terminals of the second and third transistors, respectively, a source terminal connected to the output terminal of the unity gain buffer, a substrate terminal connected to ground, and a gate terminal for receiving the switching signal.

11. The VCO of claim 10, wherein the switch further comprises a fifth transistor having a source terminal connected to the drain terminal of the fourth transistor, a drain terminal connected to the output terminal of the unity gain buffer, a substrate terminal connected to the voltage source, and a gate terminal for receiving the inverted value of the switching signal.

12. The VCO of claim 11, wherein the first, second, third, and fifth transistors are positive metal-oxide semiconductor (PMOS) transistors and fourth transistor is a negative MOS transistor.

13. The VCO of claim 11, wherein the unity gain buffer has a positive input terminal connected to the drain of the third transistor, and a negative input terminal connected to its output terminal and to a source of the fourth transistor.

14. A phase-locked loop (PLL) system for outputting an oscillator signal, comprising:
   a phase-frequency detector (PFD) for receiving an input reference clock signal and generating an analog error signal based on the input reference clock signal and a feedback clock signal;
   a charge pump, connected to the PFD, for generating a drive current based on the analog error signal;
   a filter, connected to the charge pump, for generating a control voltage based on the drive current;
   a voltage-controlled oscillator (VCO) for generating the oscillator signal, comprising:

a voltage-to-current converter, connected to the analog filter, for generating a control signal based on the control voltage;

a digital-to-analog converter (DAC), connected to the voltage-to-current converter, for mirroring the control signal, the DAC comprising:

a first transistor having a gate terminal connected to the voltage-to-current converter for receiving the control signal, and source and substrate terminals connected to a voltage source, wherein the first transistor generates a first intermediate signal;

a second transistor having a source terminal connected to a drain terminal of the first transistor for receiving the first intermediate signal, a substrate terminal connected to the voltage source, and a gate terminal for receiving a switching signal, wherein the second transistor generates a second intermediate signal;

a third transistor having a source terminal connected to a drain terminal of the second transistor for receiving the second intermediate signal, a substrate terminal connected to the voltage source, and a gate terminal for receiving the switching signal, wherein the third transistor generates a third intermediate signal;

a unity gain buffer, connected to the third transistor for receiving the third intermediate signal and generating a fourth intermediate signal; and a switch, connected to an output terminal of the unity gain buffer, and drain and source terminals of the second and the third transistors, respectively, for transmitting the fourth intermediate signal to the source terminal of the third transistor based on an inverted switching signal and the switching signal;

a current-controlled oscillator (CCO), connected to the DAC, for receiving the third intermediate signal and generating the oscillator signal; and a frequency divider, connected to the CCO, for generating the feedback clock signal by adjusting the frequency of the oscillator signal.

15. The PLL of claim 14, wherein the switch comprises a fourth transistor having a drain terminal connected to drain and source terminals of the second and third transistors, respectively, a source terminal connected to the output terminal of the unity gain buffer, a substrate terminal connected to the ground, and a gate terminal for receiving the switching signal.

16. The PLL of claim 15, wherein the switch further comprises a fifth transistor having a source terminal connected to the drain terminal of the fourth transistor, a drain terminal connected to the output terminal of the unity gain buffer, a substrate terminal connected to the voltage source, and a gate terminal for receiving the inverted switching signal.

17. The PLL of claim 16, wherein the switching and inverted switching signals are generated based on an operating frequency of the PLL.

18. The PLL of claim 16, wherein the first, second, third, and fifth transistors are positive metal-oxide semiconductor (PMOS) transistors and fourth transistor is a negative MOS transistor.

19. The PLL of claim 16, wherein the unity gain buffer has a positive input terminal connected to the drain of the third transistor, and a negative input terminal connected to its output terminal and to a source of the fourth transistor.

* * * * *